United States Patent
Hikmet et al.

(10) Patent No.: US 12,092,301 B2
(45) Date of Patent: Sep. 17, 2024

(54) LIGHTING ARRANGEMENT COMPRISING A SUBSTRATE FOR LIGHT EMITTING ELEMENTS

(71) Applicant: SIGNIFY HOLDING B.V., Eindhoven (NL)

(72) Inventors: Rifat Ata Mustafa Hikmet, Eindhoven (NL); Ties Van Bommel, Horst (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 0 days.

(21) Appl. No.: 16/968,152

(22) PCT Filed: Feb. 8, 2019

(86) PCT No.: PCT/EP2019/053147
§ 371 (c)(1),
(2) Date: Aug. 6, 2020

(87) PCT Pub. No.: WO2019/154993
PCT Pub. Date: Aug. 15, 2019

(65) Prior Publication Data
US 2021/0364157 A1    Nov. 25, 2021

(30) Foreign Application Priority Data
Feb. 12, 2018  (EP) .................................... 18156315

(51) Int. Cl.
*F21V 23/00* (2015.01)
*H05K 1/02* (2006.01)
(Continued)

(52) U.S. Cl.
CPC ......... *F21V 23/005* (2013.01); *H05K 1/0203* (2013.01); *F21K 9/00* (2013.01);
(Continued)

(58) Field of Classification Search
CPC ................ F21V 23/005; H05K 1/0203; H05K 2201/10106; F21Y 2115/10; F21K 9/90
See application file for complete search history.

(56) References Cited

U.S. PATENT DOCUMENTS 5,012,387 A * 4/1991 Ohlenburger ........ H05K 1/0206
361/708
5,172,301 A * 12/1992 Schneider ............. H01L 23/367
174/16.3
(Continued)

FOREIGN PATENT DOCUMENTS

EP           2527729 A1    11/2012
EP           3009731 A1    4/2016
(Continued)

*Primary Examiner* — Evan P Dzierzynski
*Assistant Examiner* — Nathaniel J Lee

(57) ABSTRACT

A lighting arrangement (10) is disclosed, comprising a substrate (11) for mechanically and electrically connecting at least one light-emitting element (12) thereto. The substrate (11) comprises at least a first side (13) and a second side (14), and a circumferential edge (20) along a periphery of the substrate, the circumferential edge (20) extending between the first side (13) and the second side (14), and at least one electrically conductive region (16) disposed on the first side (13). The lighting arrangement (10) comprises at least one thermally conductive element (18) arranged such that the at least one thermally conductive element (18) is coupled to at least a portion of the second side (14) and to at least a portion of an outer surface (17) of the circumferential edge (20), and such that the at least one thermally conductive element (18) is not coupled to the at least one electrically conducting region (16).

14 Claims, 7 Drawing Sheets

(51) Int. Cl.
*F21K 9/00* (2016.01)
*F21K 9/90* (2016.01)
*F21Y 115/10* (2016.01)

(52) U.S. Cl.
CPC ............ *F21K 9/90* (2013.01); *F21Y 2115/10* (2016.08); *H05K 2201/099* (2013.01); *H05K 2201/10106* (2013.01)

(56) References Cited

U.S. PATENT DOCUMENTS

| | | | | |
|---|---|---|---|---|
| 5,306,670 | A | * | 4/1994 | Mowatt .................... H01L 24/24 |
| | | | | 257/E23.173 |
| 7,980,731 | B2 | * | 7/2011 | Ohashi .................. H01L 33/483 |
| | | | | 362/296.07 |
| 2004/0029436 | A1 | | 2/2004 | Gasquet et al. |
| 2004/0184272 | A1 | | 9/2004 | Wright et al. |
| 2009/0052171 | A1 | | 2/2009 | Li |
| 2013/0020607 | A1 | * | 1/2013 | Lin ........................... F21K 9/90 |
| | | | | 257/E33.059 |
| 2015/0070913 | A1 | | 3/2015 | Yamamoto |
| 2015/0192287 | A1 | | 7/2015 | Van Es et al. |
| 2019/0215946 | A1 | * | 7/2019 | Wu ......................... F28D 15/02 |

FOREIGN PATENT DOCUMENTS

| | | | |
|---|---|---|---|
| JP | 2002216525 | A | 8/2002 |
| JP | 2013218860 | A | 10/2013 |
| JP | 2013219004 | A | 10/2013 |
| JP | 2013258082 | A | 12/2013 |
| JP | 2015529948 | A | 10/2015 |
| JP | 6178943 | B1 | 8/2017 |
| KR | 20090090813 | A | 8/2009 |

* cited by examiner

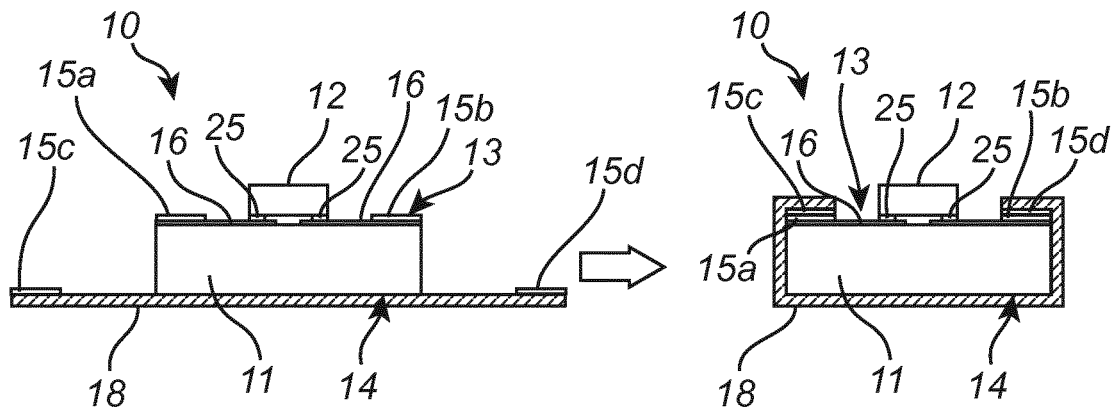
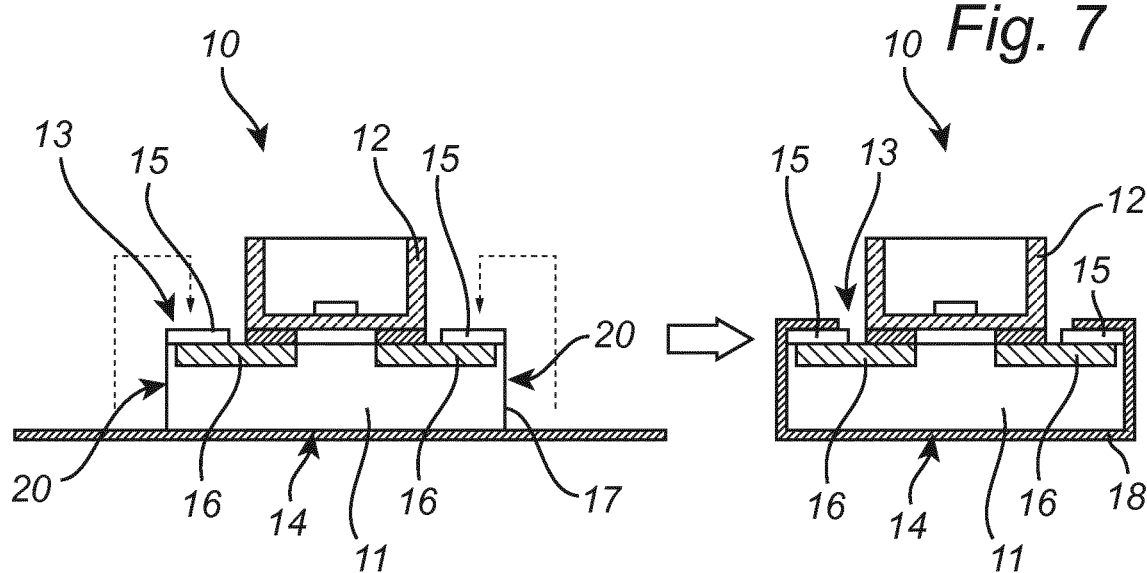
Fig. 7
Fig. 8
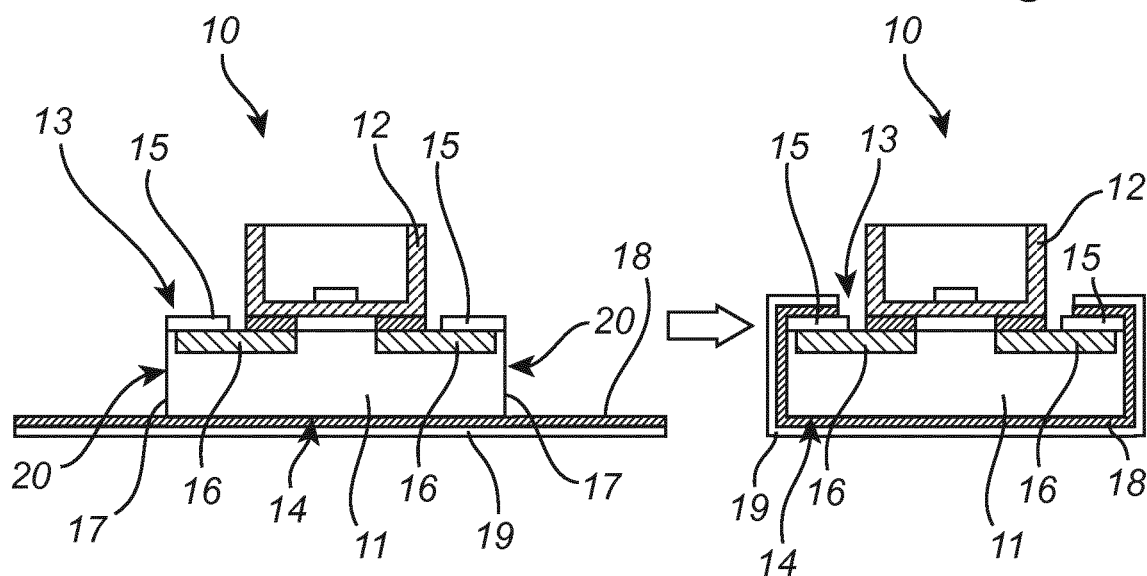
Fig. 9

LIGHTING ARRANGEMENT COMPRISING A SUBSTRATE FOR LIGHT EMITTING ELEMENTS

CROSS-REFERENCE TO PRIOR APPLICATIONS

This application is the U.S. National Phase application under 35 U.S.C. § 371 of International Application No. PCT/EP2019/053147, filed on Feb. 8, 2019, which claims the benefit of European Patent Application No. 18156315.6, filed on Feb. 12, 2018. These applications are hereby incorporated by reference herein.

TECHNICAL FIELD

The present invention relates to a lighting arrangement comprising a substrate for mechanically and electrically connecting at least one light-emitting element thereto. The substrate may for example comprise a Printed Circuit Board (PCB). The lighting arrangement may have a lower overall cost than that of a PCB while at the same time being capable of providing a relatively good thermal management, comparable to or possibly even better than that of an existing PCB.

BACKGROUND

Printed circuit boards (PCBs) are in high demand for lighting applications, such as, for example, light-emitting diode (LED) lighting applications. As the price of LEDs decreases, the price of the PCB may become significant with respect to the overall cost of the component or element comprising the PCB(s) and LED(s). In applications such as lighting applications, PCBs are often used which have a size that may be larger than what may be required for achieving the necessary electrical functionality. PCBs often have conductive tracks, such as, for example, copper tracks, for powering light-emitting elements arranged on the PCBs. Because such conductive tracks in general also are used for achieving a heat spreading and/or heat sinking functionality, the dimensions of the PCB (e.g., the width of the PCB) may need to be larger than required for achieving the necessary electrical functionality—for example for achieving a sufficiently large electrical conductivity (or a sufficiently low electrical resistance).

SUMMARY

In view of the above discussion, a concern of the present invention is to provide means for reducing an overall cost of a component or element comprising a substrate such as a PCB for coupling one or more light-emitting elements such as LED(s) thereto.

To address at least one of these concerns and other concerns, a lighting arrangement in accordance with the independent claim is provided. Preferred embodiments are defined by the dependent claims.

According to a first aspect of the present invention, a lighting arrangement is provided. The lighting arrangement comprises a substrate for mechanically and electrically connecting at least one light-emitting element thereto. The substrate comprises at least a first side and a second side. The substrate comprises a circumferential edge along a periphery of the substrate, which circumferential edge extends between the first side and the second side, and at least one electrically conductive region disposed on the first side. At least one electrically conductive region is arranged such that at least one light-emitting element connected to the substrate is connected to the at least one electrically conductive region such that electrical power can be provided to the at least one light-emitting element via the at least one electrically conductive region. The lighting arrangement comprises at least one thermally conductive element. The at least one thermally conductive element is arranged such that the at least one thermally conductive element is coupled to at least a portion of the second side and to at least a portion of an outer surface of the circumferential edge, and such that the at least one thermally conductive element is not coupled to the at least one electrically conducting region.

The substrate may for example comprise a PCB (or several PCBs). The at least one electrically conductive region may for example comprise, or be constituted by, at least one electrically conductive track. As will be further described in the following, the lighting arrangement, e.g., the substrate thereof, may comprise at least one electrically insulating element. The at least one electrically conductive track and the at least one electrically insulating element may be disposed on the first side of the substrate, such as, for example, the PCB. In alternative, or in addition, the substrate could however comprise another or other types of substrates for mechanically and electrically connecting at least one light-emitting element thereto and comprising at least one electrically conductive region disposed on a first side of the substrate and possibly at least one electrically insulating element.

By the providing of the at least one thermally conductive element, and by means of arranging the at least one thermally conductive element such that it or they is or are coupled to at least a portion of the second side of the substrate and to at least a portion of an outer surface of the circumferential edge of the substrate, and not coupled to the at least one electrically conducting region of the substrate, the at least one electrically conducting region may not have to be sized and/or dimensioned so as to be able to provide for a sufficient thermal management capability or capacity, such as, for example, heat spreading and/or heat sinking functionality or capability or capacity, and may only have to be sized and/or dimensioned so as to be able to provide for a sufficient electrical functionality or capability or capacity—for example for achieving a sufficiently large electrical conductivity (or a sufficiently low electrical resistance). A sufficient thermal management capability or capacity may be achieved by means of the at least one thermally conductive element being coupled to the second side and to the circumferential edge of the substrate. In contrast to this, in existing PCBs, for example, copper tracks provided on the PCBs often have both heat spreading and/or heat sinking functionality or capability or capacity and electrical functionality or capability or capacity, and may therefore need to be relatively large. In turn, the substrate on which the copper tracks are arranged may be required to have a relatively large size in order to be able to accommodate the copper tracks thereon. In particular, the substrate on which the copper tracks are arranged may be larger than required for providing the necessary electrical functionality or capability or capacity. An example of such an existing PCB is illustrated in FIGS. 1 and 2, which are described further in the following. By means of that the at least one electrically conducting region may not have to be sized and/or dimensioned so as to be able to provide for a sufficient thermal management capability or capacity, but only so as to be able to provide for a sufficient electrical functionality or capability or capacity, the substrate in the lighting arrangement according to the first aspect may have a relatively small size (e.g., it may only need a relatively small area for accommodating the at least one electrically conducting region; for example, the substrate may have a relatively small surface area), and the cost of the substrate may therefore be relatively low. It follows that the price of the overall arrangement or any component including the lighting arrangement may be kept relatively low, while still providing for a sufficient thermal management capability or capacity.

The substrate may comprise at least one layer. For example, the substrate may comprise several layers, which may have the same size and/or shape, or different size and/or shape. The layers of the substrate may for example be laminated onto each other.

The substrate may for example comprise a base layer, an electrically insulating layer, and at least one electrically conductive region, possibly similarly as to in an existing PCB. The electrically insulating layer may be arranged between the base layer and the at least one electrically conductive region.

If the substrate comprises several layers, there may possibly be one or more electrically insulating layers arranged between different electrically conductive regions, such as, for example, electrically conductive tracks, of the substrate (e.g., between adjacently arranged electrically conductive regions).

The at least one thermally conductive element may be arranged so as to further facilitate thermal management in the lighting arrangement, e.g., so as further facilitate heat spreading and/or heat sinking. For example, the at least one thermally conductive element may possibly be arranged such that the at least one thermally conductive element is coupled to at least a portion of the first side. The at least one thermally conductive element may be arranged such that the thermally conductive element is coupled to the second side across the entire, or substantially the entire, second side.

The at least one thermally conductive element may be directly coupled, or indirectly coupled, to at least a portion of the second side and to at least a portion of an outer surface of the circumferential edge and possibly to at least a portion of the first side, respectively. Such an indirect coupling may for example be achieved via one or more intermediate components, such as, for example, at least one connecting component configured to facilitate or enable connection or coupling of the at least one thermally conductive element to at least a portion of the second side and to at least a portion of an outer surface of the circumferential edge and possibly to at least a portion of the first side, respectively. Such a connecting component may for example comprise an adhesive or glue component, e.g., an adhesive or glue layer, or some other type of component by which the at least one thermally conductive element may be adhered to at least a portion of the second side and to at least a portion of an outer surface of the circumferential edge and possibly to at least a portion of the first side, respectively. The adhesive or glue component, e.g., an adhesive or glue layer, may comprise a thermal adhesive or thermal glue.

At least one thermally conductive element (of the at least one thermally conductive element) may be fixedly coupled to at least a portion of the second side of the substrate, for example by the at least one thermally conductive element being glued and/or laminated onto at least a portion of the second side, while the at least one thermally conductive element may be coupled to at least a portion of an outer surface of the circumferential edge and possibly at least a portion of the first side of the substrate for example by bending of the at least one thermally conductive element such that it contacts at least a portion of an outer surface of the circumferential edge and possibly at least a portion of the first side of the substrate. Possibly, the at least one thermally conductive element may be coupled to at least a portion of an outer surface of the circumferential edge and possibly at least a portion of the first side of the substrate without the at least one thermally conductive element being glued and/or laminated (for example) onto the circumferential edge or the first side of the substrate (but it could be).

The substrate may be configured to mechanically and electrically connect at least one light-emitting element to the substrate. To that end, the substrate may for example comprise at least one PCB, as indicated in the foregoing. At least one light-emitting element may be connected to (the) at least one electrically conducting region. At least one electrically conducting region may be arranged such that the at least one electrically conducting region is connectable to a power source for connecting the at least one light-emitting element to the power source in order to provide electrical power to the at least one light-emitting element.

The at least one light-emitting element may for example include or be constituted by a solid state light emitter. Examples of solid state light emitters include light-emitting diodes (LEDs), organic LEDs (OLEDs), and laser diodes. Solid state light emitters are relatively cost efficient light sources since they in general are relatively inexpensive and have a relatively high optical efficiency and a relatively long lifetime. However, in the context of the present application, the term "light-emitting element" should be understood to mean substantially any device or element that is capable of emitting radiation in any region or combination of regions of the electromagnetic spectrum, for example the visible region, the infrared region, and/or the ultraviolet region, when activated e.g. by applying a potential difference across it or passing a current through it. Therefore, a light-emitting element can have monochromatic, quasi-monochromatic, polychromatic or broadband spectral emission characteristics. Examples of light-emitting elements include semiconductor, organic, or polymer/polymeric LEDs, violet LEDs, blue LEDs, optically pumped phosphor coated LEDs, optically pumped nano-crystal LEDs or any other similar devices as would be readily understood by a person skilled in the art. Furthermore, the term light-emitting element can, according to one or more embodiments of the present invention, mean a combination of the specific light-emitting element or light-emitting elements which emit the radiation in combination with a housing or package within which the specific light-emitting element or light-emitting elements are positioned or arranged. For example, the term light-emitting element can encompass a bare LED die arranged in a housing, which may be referred to as a LED package. According to another example, the at least one light-emitting element may comprise a Chip Scale Package (CSP) LED, which may comprise a LED die directly attached to a substrate such as a Printed Circuit Board (PCB), and not via a sub-mount.

As mentioned in the foregoing, the lighting arrangement, e.g., the substrate thereof, may comprise at least one electrically insulating element. For example, the at least one electrically insulating element may be coupled to at least one portion of the first side and/or to at least one portion of the outer surface of the circumferential edge. The at least one electrically insulating element may be directly coupled, or indirectly coupled, to at least one portion of the first side and/or to at least one portion of the outer surface of the circumferential edge. Such an indirect coupling may for example be achieved via one or more intermediate components, such as, for example, at least one connecting component configured to facilitate or enable connection or coupling of the at least one electrically insulating element with at least one portion of the first side and/or to at least one portion of the outer surface of the circumferential edge. Such a connecting component may for example comprise an adhesive or glue component, e.g., an adhesive or glue layer (e.g., comprising a thermal adhesive or thermal glue) or some other type of component. At least a portion of at least one electrically insulating element of the substrate may be arranged on at least a portion of at least one electrically conductive region of the substrate. Each or any one of the at least one electrically conductive region of the substrate may for example be covered at least partly by at least one electrically insulating element of the substrate, as seen from above the first side of the substrate.

The at least one thermally conductive element may be arranged such that the thermally conductive element is coupled to at least a portion of at least one electrically insulating element. For example, the at least a portion of at least one electrically insulating element may be arranged on at least a portion of at least one electrically conductive region, and the at least one thermally conductive element may be arranged such that the at least a portion of at least one electrically insulating element is arranged between the thermally conductive element and the at least a portion of at least one electrically conductive region. Thereby, thermal management in the lighting arrangement, e.g., heat spreading and/or heat sinking, may be further facilitated, and the at least one thermally conductive element may be electrically insulated from the at least one electrically conductive region only where needed.

In alternative, or in addition, at least one electrically insulating element may be arranged on the at least one thermally conductive element such that at least one portion of the at least one electrically insulating element is arranged between the at least one thermally conductive element and the circumferential edge. By means of such a configuration, thermal management in the lighting arrangement, e.g., heat spreading and/or heat sinking, may be further facilitated, and it may be ensured that the at least one thermally conductive element is electrically insulated from the at least one electrically conductive region to a relatively large extent or even that the at least one thermally conductive element is completely, or substantially completely, electrically insulated from the at least one electrically conductive region.

The at least one thermally conductive element may for example comprise at least one layer of thermally conductive material. However, other forms and/or shapes of the at least one thermally conductive element are possible.

The thermal conductivity of the thermally conductive element is preferably at least 50 W $m^{-1}$ $K^{-1}$, more preferably at least 80 W $m^{-1}$ $K^{-1}$, and most preferably at least 100 W $m^{-1}$ $K^{-1}$. For example, the thermal conductivity of the thermally conductive element if made of aluminum may be about 200 W $m^{-1}$ $K^{-1}$. The thermal conductivity of the thermally conductive element if made of copper may be about 400 W $m^{-1}$ $K^{-1}$.

The second side of the substrate may be opposite, or substantially opposite, to the first side of the substrate. Thus, the first and second sides of the substrate may be opposite, or substantially opposite, sides of the substrate. As mentioned in the foregoing, the at least one thermally conductive element may comprise at least one layer of thermally conductive material. The first side of the substrate may comprise a first side, or surface, of at least one layer of thermally conductive material, and the second side of the substrate may comprise the side of the at least one layer of thermally conductive material opposite to the first side, or surface.

The lighting arrangement may comprise at least two thermally conductive elements. The at least two thermally conductive elements may comprise at least a first thermally conductive element and a second thermally conductive element. The first thermally conductive element may be arranged on the second thermally conductive element. For example, each of the first thermally conductive element and the second thermally conductive element may comprise at least one layer of thermally conductive material.

A thermally conductive material which the first thermally conductive element may be made of, or comprise, may be different from a thermally conductive material which the second thermally conductive element may be made of, or comprise. Thus, the first thermally conductive element and the second thermally conductive element may differ with respect to the material thereof. In alternative, or in addition, the first thermally conductive element and the second thermally conductive element may for example differ with respect to shape, size and/or thickness.

The at least one thermally conductive element may for example be made of, or comprise, aluminum. However, other materials having a relatively high thermal conductivity may be used in alternative, or in addition.

As mentioned in the foregoing, the substrate may be configured to mechanically and electrically connect at least one light-emitting element thereto. The at least one thermally conductive element may comprise at least one opening. At least one opening may correspond to at least one light-emitting element mechanically and electrically connected to the substrate. The at least one thermally conductive element may be arranged relatively to the at least one light-emitting element, or vice versa, such that at least one light-emitting element corresponding to at least one opening extends through the at least one opening. The at least one opening may be dimensioned and/or sized in relation to its corresponding at least one light-emitting element such that an inner surface of the opening is not in contact with the at least one light-emitting element extending through the at least one opening.

The lighting arrangement may comprise a plurality of electrically insulating elements, wherein at least one of the plurality of electrically insulating elements for example may be disposed on at least a portion of the first side of the substrate.

The lighting arrangement may comprise a plurality of thermally conductive elements.

The plurality of thermally conductive elements may be arranged such that the respective ones of the plurality of thermally conductive elements are coupled to respective, different, portions of an outer surface of the circumferential edge, and/or to different portions of the second side.

According to one or more embodiments of the present invention, the lighting arrangement may comprise at least one attachment element, which may be configured to fixate the at least one thermally conductive element in a position in which the at least one thermally conductive element is coupled to at least a portion of the second side and at least a portion of the outer surface of the circumferential edge, and in which the at least one thermally conductive element is not coupled to the at least one electrically conducting region.

The at least one attachment element may for example comprise at least one protrusion disposed on the substrate, which at least one protrusion may be configured to fit into at least one corresponding receiving opening in the at least one thermally conductive element. Thus, the at least one protrusion may be configured to mate with at least one corresponding receiving opening in the at least one thermally conductive element. Each or any of the at least one protrusion may for example be disposed on the first side or the second side of the substrate, or on the circumferential edge of the substrate. The at least one corresponding receiving opening may be comprised in the least one attachment element. In alternative, or in addition, the at least one attachment element may for example comprise one or more of at least one clamp, at least one hook, and/or at least one clip or the like. The at least one clamp, at least one hook, and/or at least one clip or the like may be connected or comprised in the at least one thermally conductive element, and may be configured to engage with the substrate.

For facilitating or allowing for components or elements of the lighting arrangement to be fixedly arranged with respect to each other, for example, the lighting arrangement may be arranged such that it is partially or completely encased or encapsulated in a polymer such as, for example, silicone rubber or another silicone material, or in another appropriate material.

According to a second aspect, there is provided a lighting device comprising a lighting arrangement according to the first aspect. The substrate of the lighting arrangement may be configured to mechanically and electrically connect at least one light-emitting element thereto. At least one electrically conducting region may be arranged such that the least one electrically conducting region is connectable to a power source for connecting the at least one light-emitting element to the power source in order to provide electrical power to the at least one light-emitting element. The power source may be comprised in the lighting device, or in the substrate. However, it is to be understood that the power source must not necessarily be part of the lighting device or the substrate. The power source may for example comprise one or more batteries, or a connection or coupling to a power system, such as, for example, a mains power system.

The lighting device may for example comprise a lamp, light engine or luminaire. The lamp may for example comprise or be constituted by a LED lamp. A lighting device according to the second aspect may hence for example be used in a LED lamp. The lamp may for example comprise a filament lamp, such as a halogen, or incandescent replacement lamp, or an arc lamp, such as a high pressure sodium replacement lamp. The lamp or luminaire may for example be used in one or more of the following applications: digital projection, automotive lighting, stage lighting, shop lighting, home lighting, accent lighting, spot lighting, theater lighting, fiber optic lighting, display systems, warning lighting systems, medical lighting applications, decorative lighting applications.

Further objects and advantages of the present invention are described in the following by means of exemplifying embodiments. It is noted that the present invention relates to all possible combinations of features recited in the claims. Further features of, and advantages with, the present invention will become apparent when studying the appended claims and the description herein. Those skilled in the art realize that different features of the present invention can be combined to create embodiments other than those described herein.

BRIEF DESCRIPTION OF THE DRAWINGS

Exemplifying embodiments of the invention will be described below with reference to the accompanying drawings.

Each of FIGS. 3-7 is a schematic sectional side view of an arrangement according to an embodiment of the present invention, in an in part assembled state (left), and in an assembled state (right).

FIG. 8 is a schematic sectional side view of a lighting arrangement according to an embodiment of the present invention, in an in part assembled state (left), and in an assembled state (right).

FIG. 9 is a schematic sectional side view of a lighting arrangement according to another embodiment of the present invention, in an in part assembled state (left), and in an assembled state (right).

Figure 10:
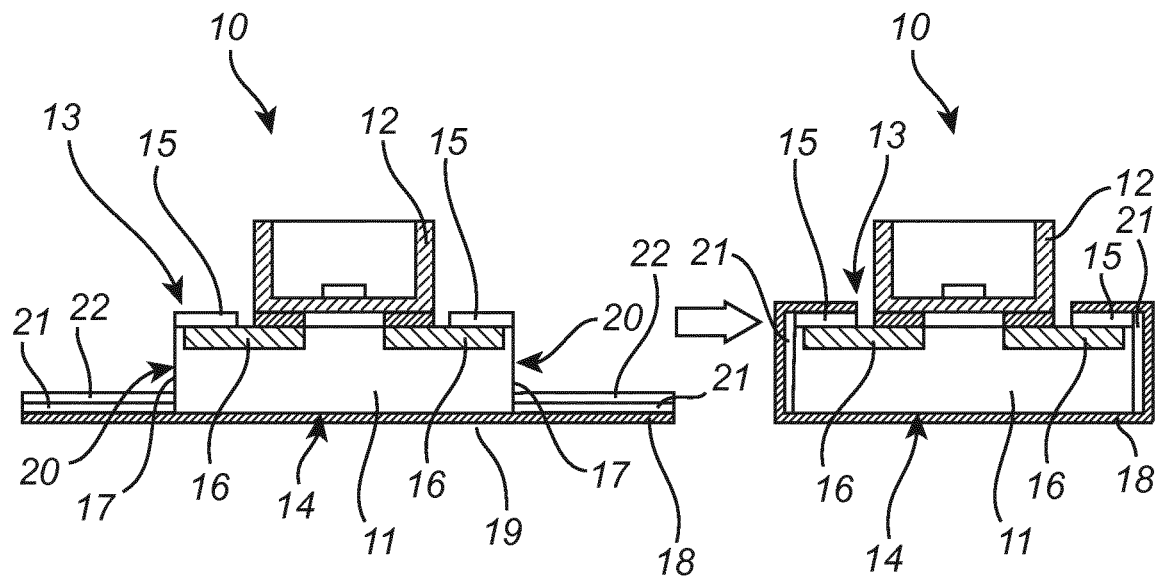

FIG. 10 is a schematic sectional side view of a lighting arrangement according to another embodiment of the present invention, in an in part assembled state (left), and in an assembled state (right).

Figure 11:
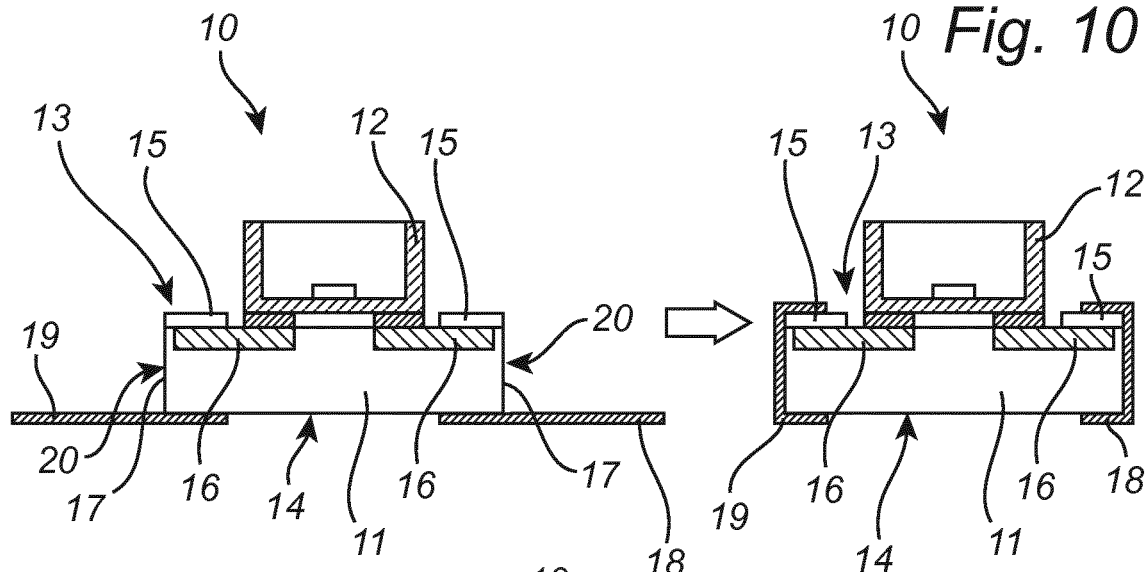

FIG. 11 is a schematic sectional side view of a lighting arrangement according to another embodiment of the present invention, in an in part assembled state (left), and in an assembled state (right).

Figure 12:
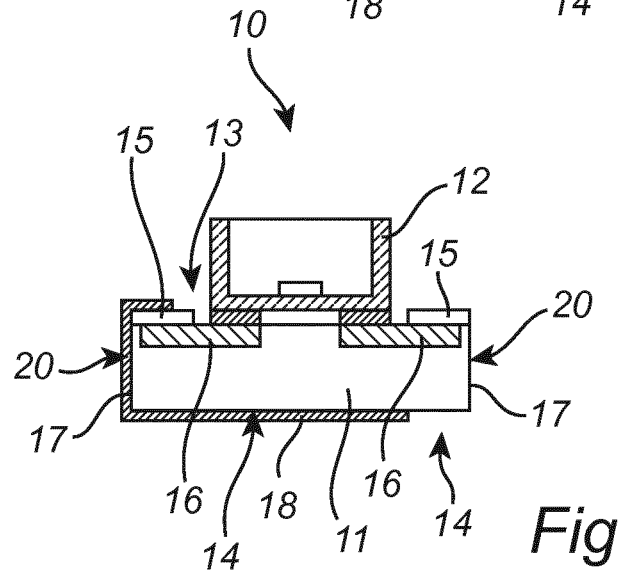

FIG. 12 is a schematic sectional side view of a lighting arrangement according to an embodiment of the present invention.

Figure 13:
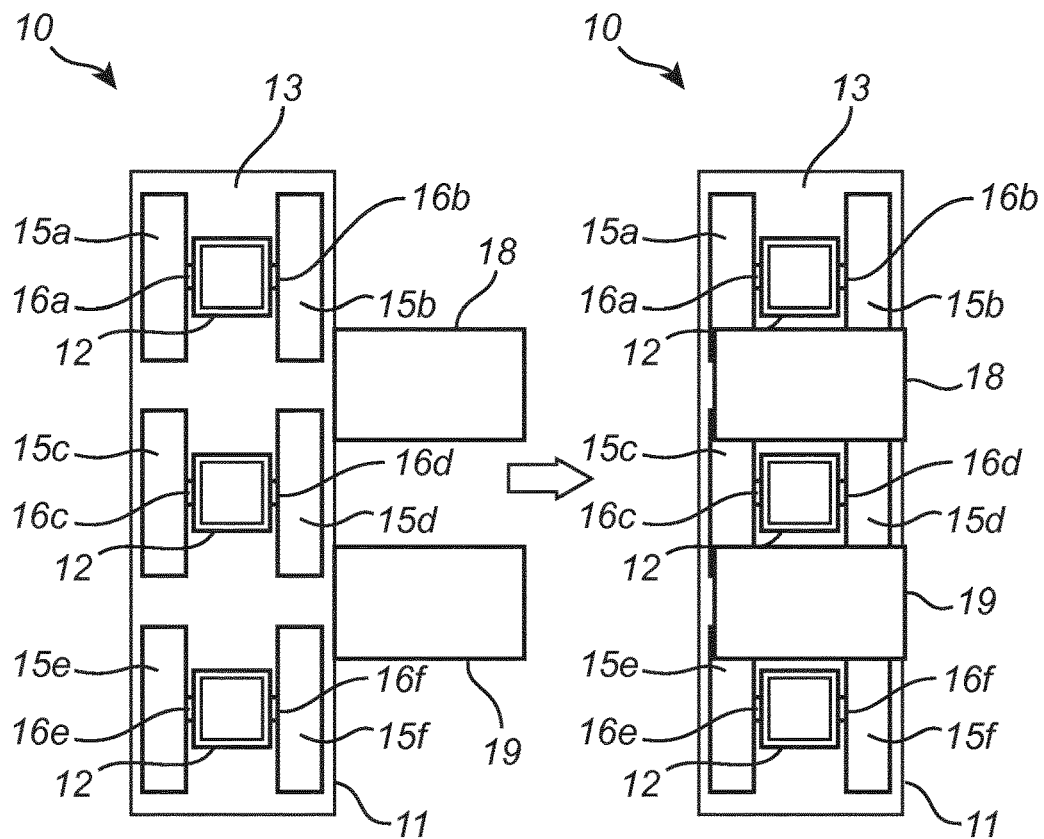

FIG. 13 is a schematic sectional side view of a portion of a lighting arrangement according to an embodiment of the present invention from above a first side of the lighting arrangement, in an in part assembled state (left), and in an assembled state (right).

Figure 14:
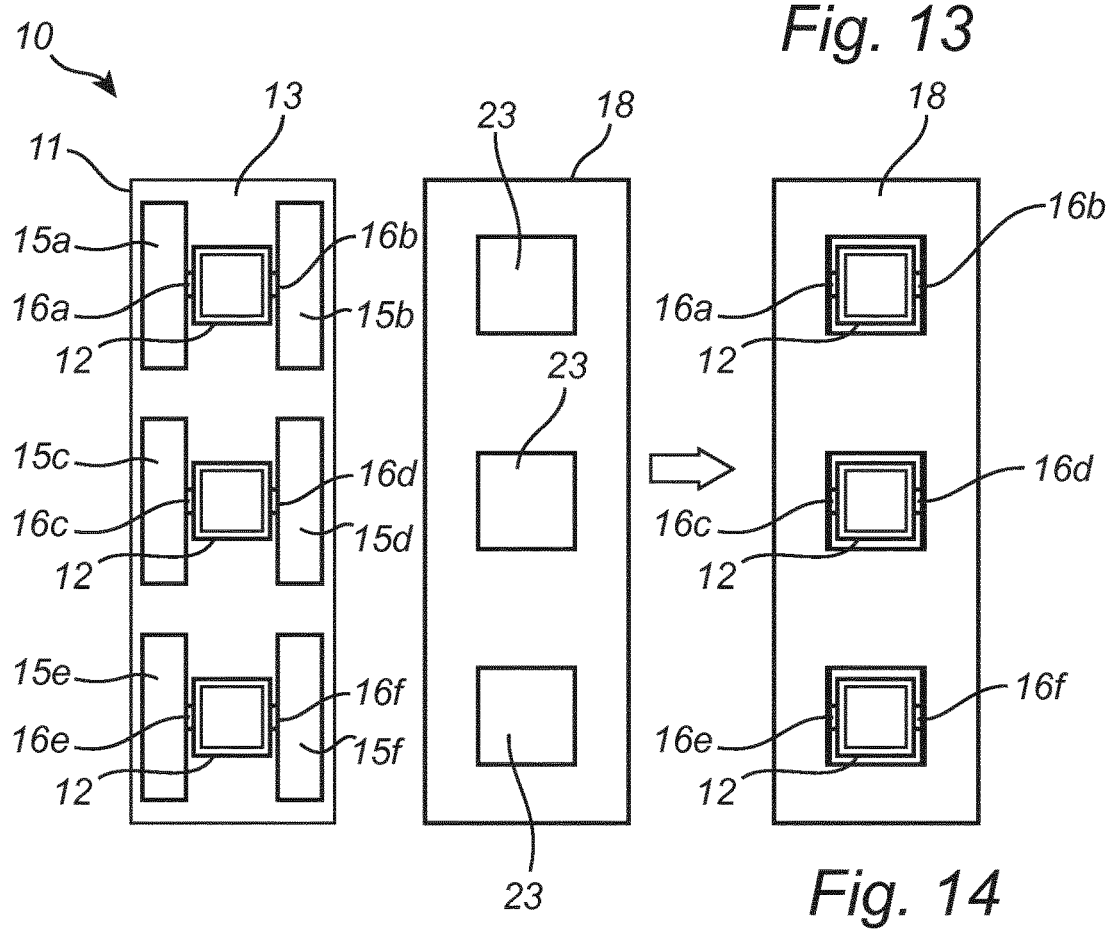

FIG. 14 is a schematic sectional side view of a portion of a lighting arrangement according to another embodiment of the present invention from above a first side of the lighting arrangement, in an in part assembled state (left), and in an assembled state (right).

Figure 15:
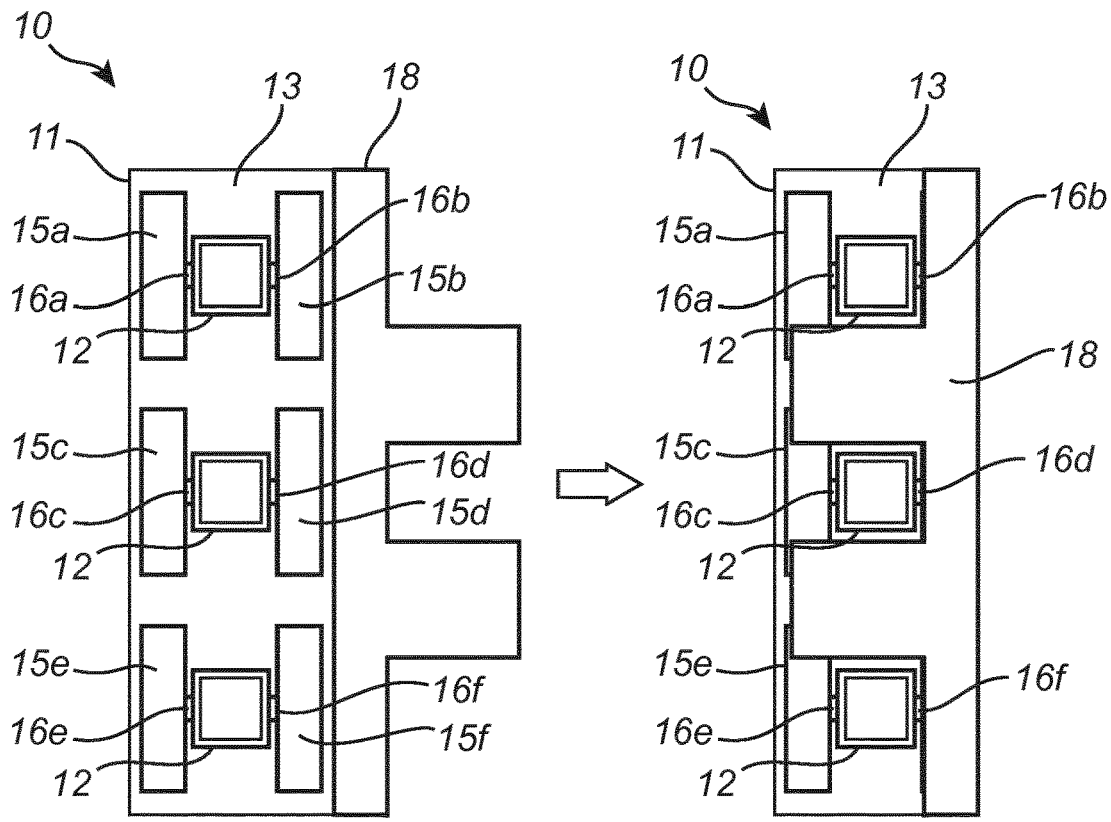

FIG. 15 is a schematic sectional side view of a portion of a lighting arrangement according to an embodiment of the present invention from above a first side of the lighting arrangement, in an in part assembled state (left), and in an assembled state (right).

Figure 16:
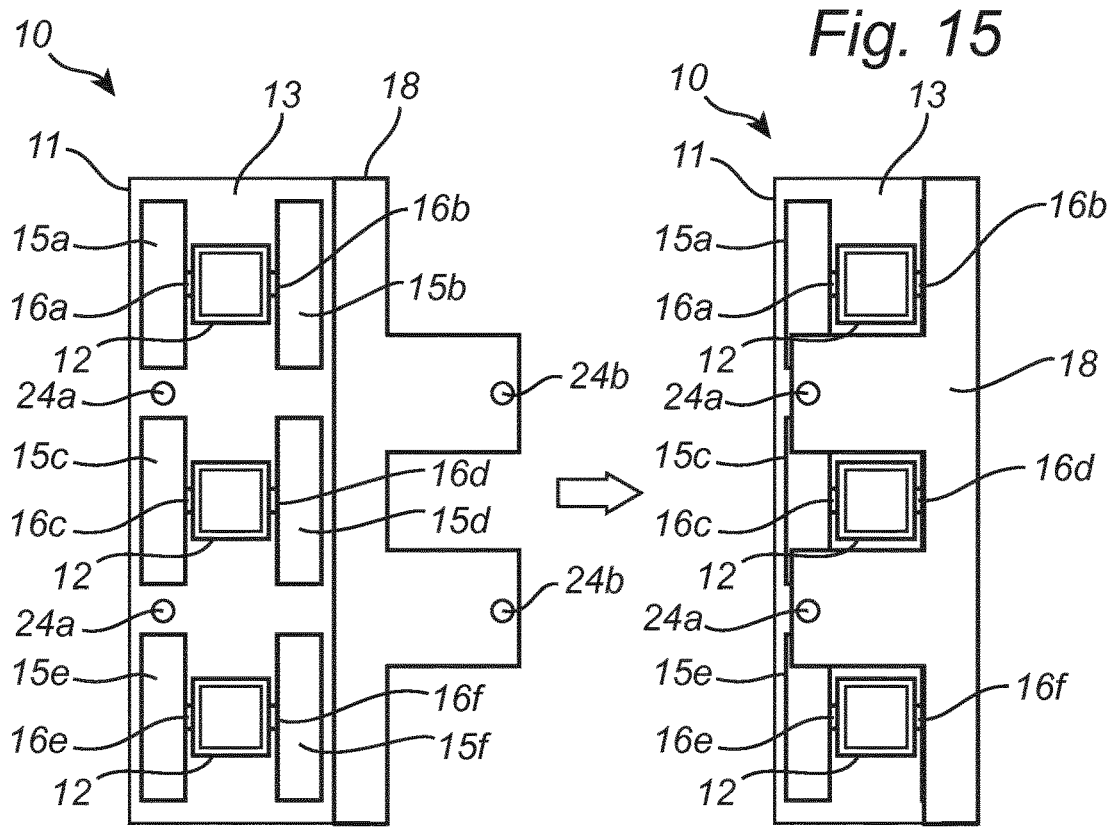

FIG. 16 is a schematic sectional side view of a portion of a lighting arrangement according to another embodiment of the present invention from above a first side of the lighting arrangement, in an in part assembled state (left), and in an assembled state (right).

Figure 17:
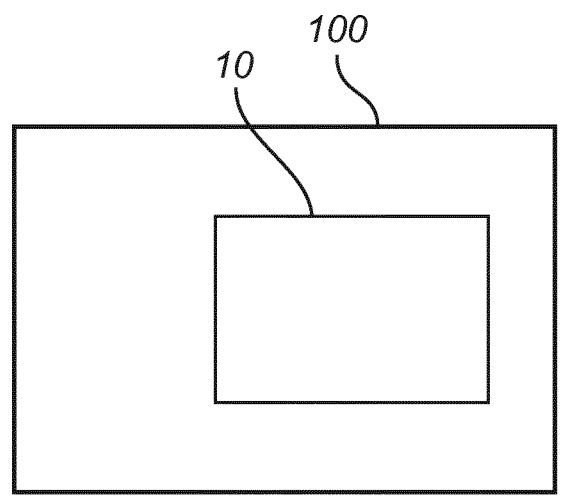

FIG. 17 is a schematic block diagram of a lamp, light engine or a luminaire according to an embodiment of the present invention.

All the figures are schematic, not necessarily to scale, and generally only show parts which are necessary in order to elucidate embodiments of the present invention, wherein other parts may be omitted or merely suggested.

DETAILED DESCRIPTION

The present invention will now be described hereinafter with reference to the accompanying drawings, in which exemplifying embodiments of the present invention are shown. The present invention may, however, be embodied in many different forms and should not be construed as limited to the embodiments of the present invention set forth herein; rather, these embodiments of the present invention are provided by way of example so that this disclosure will convey the scope of the invention to those skilled in the art. In the drawings, identical reference numerals denote the same or similar components having a same or similar function, unless specifically stated otherwise.

Figure 1:
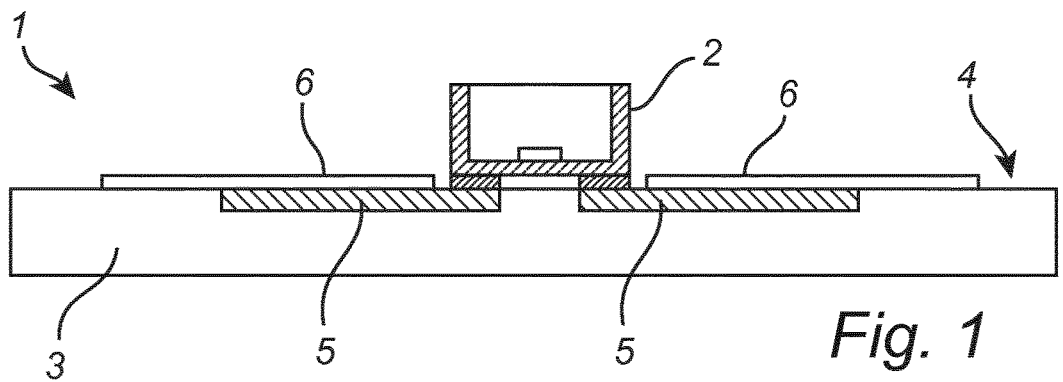
FIG. 1 is a schematic sectional side view of a PCB according to an example.
Figure 2:
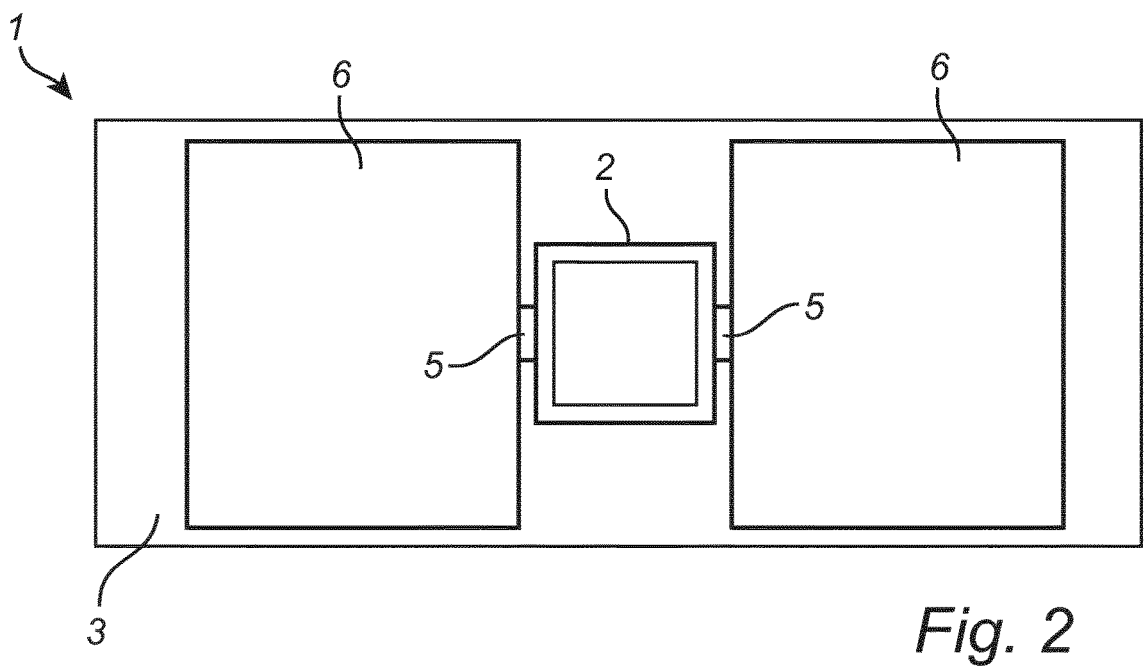
FIG. 2 is a schematic view from the above of a portion of the PCB illustrated in FIG. 1.

FIG. 1 is a schematic sectional side view of a PCB 1 according to an example. FIG. 2 is a schematic view from the above of a portion of the PCB 1 illustrated in FIG. 1. The PCB 1 is configured to mechanically and electrically connect at least one LED 2 thereto. The PCB 1 comprises a substrate 3. On a first side 4 of the substrate 3, electrically conductive tracks 5, such as, for example, copper tracks, are arranged, for powering the LED 2. The PCB 1 comprises electrically insulating tracks 6. Two electrically conductive tracks 5 and two electrically insulating tracks 6 are shown in FIGS. 1 and 2. As illustrated in FIGS. 1 and 2, each electrically insulating track 6 is arranged in part on a respective one of the electrically conductive tracks 5. In existing PCBs, the electrically conductive tracks 5 often have both heat spreading and/or heat sinking functionality or capability or capacity and electrical functionality or capability or capacity, and may therefore need to be relatively large, which may require the substrate 3 to have a relatively large size in order to be able to accommodate the electrically conductive tracks 5 thereon. In particular, the substrate 3 may have to be larger than required for providing the necessary electrical functionality or capability or capacity.

Figure 3:
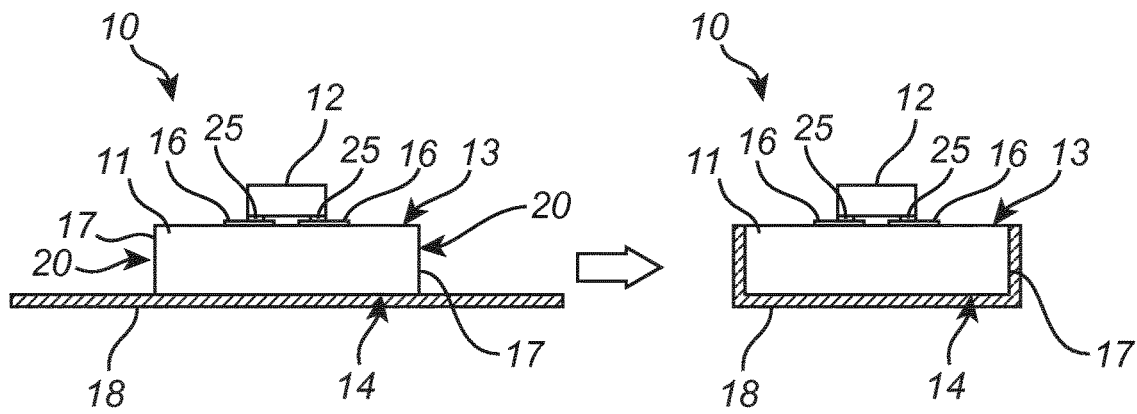

FIG. 3 is a sectional side view of a lighting arrangement 10 according to an embodiment of the present invention, in an in part assembled state (left), and in an assembled state (right). The lighting arrangement 10 comprises a substrate 11, which is configured to mechanically and electrically connect at least one light-emitting element 12 thereto. In accordance with the embodiment of the present invention illustrated in FIG. 3, the at least one light-emitting element 12 comprises a LED 12. It is however to be understood that the at least one light-emitting element 12 in alternative, or in addition, could comprise another or other types of light-emitting elements. Also, it is to be understood that even though only one light-emitting element 12 is illustrated in FIG. 3, the lighting arrangement 10 could comprise in principle any number of light-emitting elements which the substrate 11 may be configured to mechanically and electrically connect to the substrate 11, as long as the substrate 11 has a size sufficient to allow for coupling of such a number of light-emitting elements thereto.

The substrate 11 comprises a first side 13 and a second side 14. In accordance with the embodiment of the present invention illustrated in FIG. 3, the second side 14 is opposite to the first side 13. Thus, the first and second sides 13, 14 of the substrate 11 may be opposite, or substantially opposite, sides of the substrate 11. The substrate 11 comprises a circumferential edge 20 along a periphery of the substrate 11. As illustrated in FIG. 3, the circumferential edge 20 is extending between the first side 13 and the second side 14.

The substrate 11 comprises electrically conductive regions 16 disposed on the first side 13 of the substrate 11. In accordance with the embodiment of the present invention illustrated in FIG. 3, the electrically conductive regions 16 comprise electrically conductive tracks which are arranged on an outer surface of the substrate 11 at the first side 13 thereof. However, it is to be understood that another or other types of electrically conductive regions are possible. As illustrated in FIG. 3, each of the electrically conductive regions 16—or electrically conductive tracks—is coupled to the light-emitting element 12 via respective ones of two electrical contacts 25. While there in FIG. 3 are shown two electrically conductive regions 16, it is to be understood that the number of electrically conductive regions 16 shown is according to an example, and that there may be more or less than two electrically conductive regions comprised in or on the substrate 11.

The electrically conductive regions 16 are arranged such that the light-emitting element 12 connected to the substrate 11 is connected to the electrically conductive regions 16, via the electrical contacts 25, such that electrical power can be provided to the at least one light-emitting element 12 via the electrically conductive regions 16. The electrically conducting regions 16 of the substrate 11 may be arranged such that the electrically conducting regions 16 are connectable to a power source (not shown in FIG. 3) for connecting the light-emitting element 12 to the power source in order to provide electrical power to the light-emitting element 12.

The lighting arrangement 10 comprises a thermally conductive element 18. In accordance with the embodiment of the present invention illustrated in FIG. 3, the thermally conductive element 18 comprises a layer of thermally conductive material. As indicated in the left part of FIG. 3, the thermally conductive element 18 is arranged such that the thermally conductive element 18 is coupled to at least a portion of the second side 14 of the substrate 11. As indicated in the right part of FIG. 3, the thermally conductive element 18 is arranged such that the thermally conductive element 18 is coupled to at least a portion of an outer surface 17 of the circumferential edge 20, and such that the thermally conductive element 18 is not coupled to the electrically conducting regions 16. Possibly, the thermally conductive element 18 could be arranged such that the thermally conductive element 18 is coupled to the second side 14 across the entire, or substantially entire, second side 14. In alternative, or in addition, the thermally conductive element 18 could be arranged such that the thermally conductive element 18 is coupled to the outer surface 17 of the circumferential edge 20 across the entire, or substantially entire, outer surface 17 of the circumferential edge 20.

The coupling of the thermally conductive element 18 to the substrate 11 may for example be achieved by way of at least one connecting component (not shown in FIG. 3) configured to facilitate or enable the coupling or connection. Such a connecting component may for example comprise an adhesive or glue component, e.g., an adhesive or glue layer, or some other type of component. The adhesive or glue component, e.g., an adhesive or glue layer, may comprise a thermal adhesive or thermal glue.

As indicated in FIG. 3, the lighting arrangement 10 may possibly comprise a single thermally conductive element 18. However, the lighting arrangement 10 could, in accordance with one or more embodiments of the present invention, comprise two or more thermally conductive elements, which may be separately arranged or connected with each other (or there may be one or more thermally conductive elements separately arranged with each other and one or more thermally conductive elements connected with each other). For example, there could be provided a first thermally conductive element and a second thermally conductive element where each of the first and second thermally conductive elements comprises a layer of thermally conductive material and where the layer of the first thermally conductive element is arranged on the layer of the second thermally conductive element.

Although not shown in FIG. 3, the thermally conductive element 18 could be arranged such that he thermally conductive element 18 is coupled to at least a portion of the first side 13 of the substrate.

Possibly, the thermally conductive element 18 could be fixedly coupled to at least a portion of the second side 14 of the substrate 11, for example by the thermally conductive element 18 being glued and/or laminated onto at least a portion of the second side 14, while the thermally conductive element 18 may be coupled to at least a portion of the outer surface 17 of the circumferential edge 20 and possibly at least a portion of the first side 13 of the substrate 11 for example by bending of the thermally conductive element 18 such that it contacts at least a portion of an outer surface 17 of the circumferential edge 20 and possibly at least a portion of the first side 13 of the substrate 11. Possibly, the thermally conductive element 18 may be coupled to at least a portion of the outer surface 17 of the circumferential edge 20 and possibly at least a portion of the first side 13 of the substrate 11 without the thermally conductive element 18 being glued and/or laminated onto the circumferential edge 20 or the first side 13 of the substrate 11 (but it could be).

Figure 4:
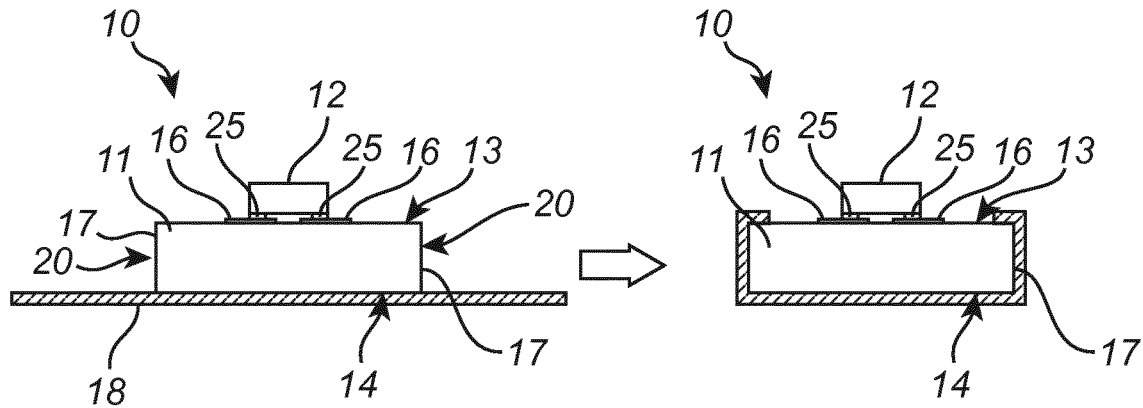

FIG. 4 is a schematic sectional side view of a lighting arrangement 10 according to another embodiment of the present invention, in an in part assembled state (left), and in an assembled state (right). The lighting arrangement 10 illustrated in FIG. 4 is similar to the lighting arrangement 10 illustrated in FIG. 3, and the same reference numerals in FIGS. 4 and 3 indicate the same or similar components, having the same or similar function. In the lighting arrangement 10 illustrated in FIG. 4, the thermally conductive element 18 is arranged such that the thermally conductive element 18 is coupled to at least a portion of the first side 13 of the substrate 11. Similar to the thermally conductive element 18 in the lighting arrangement 10 illustrated in FIG. 3, the thermally conductive element 18 in the lighting arrangement 10 illustrated in FIG. 4 comprises a layer of thermally conductive material. As indicated in FIG. 4, the thermally conductive element 18 may be bent around the circumferential edge 20 such that portions thereof become coupled to the first side 13 of the substrate 11. Another way to describe this is that the thermally conductive element 18 may be 'wrapped' around the substrate 11, or around at least a part or portion thereof.

Figure 5:
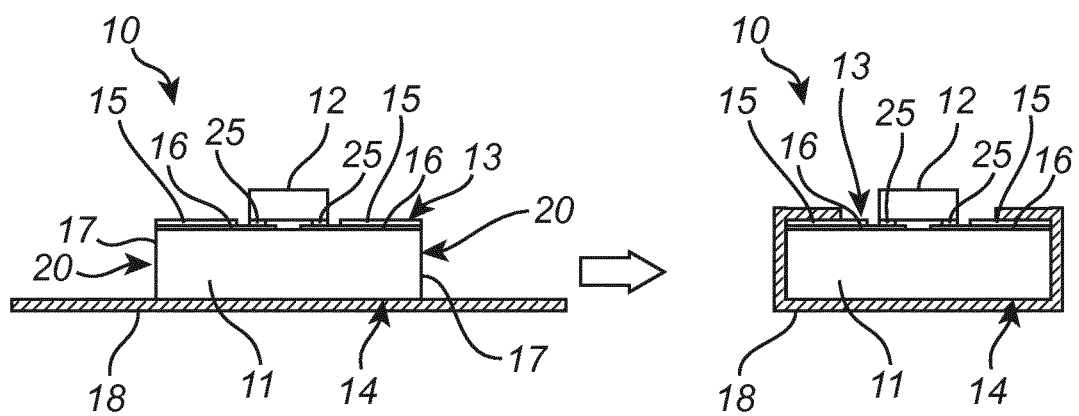

FIG. 5 is a schematic sectional side view of a lighting arrangement 10 according to another embodiment of the present invention, in an in part assembled state (left), and in an assembled state (right). The lighting arrangement 10 illustrated in FIG. 5 is similar to the lighting arrangement 10 illustrated in FIG. 4 (and in FIG. 3), and the same reference numerals in FIGS. 5 and 4 (and 3) indicate the same or similar components, having the same or similar function. The substrate 11 of the lighting arrangement 10 illustrated in FIG. 5 comprises electrically insulating elements 15, which are disposed on the first side 13 of the substrate 11 and coupled to portions of the first side 13 of the substrate 11. In accordance with the embodiment of the present invention illustrated in FIG. 5, the electrically insulating elements 15 are arranged on respective ones of the electrically conductive regions 16—or electrically conductive tracks. Thus, in accordance with the embodiment of the present invention illustrated in FIG. 5, the electrically insulating elements 15 are coupled to portions of the first side 13 of the substrate 11 via the electrically conductive regions 16. While there in FIG. 5 are shown two electrically insulating elements 15, it is to be understood that the number of electrically insulating elements 15 shown is according to an example, and that there may be more or less than two electrically insulating elements 15 comprised in or on the substrate 11.

Figure 6:
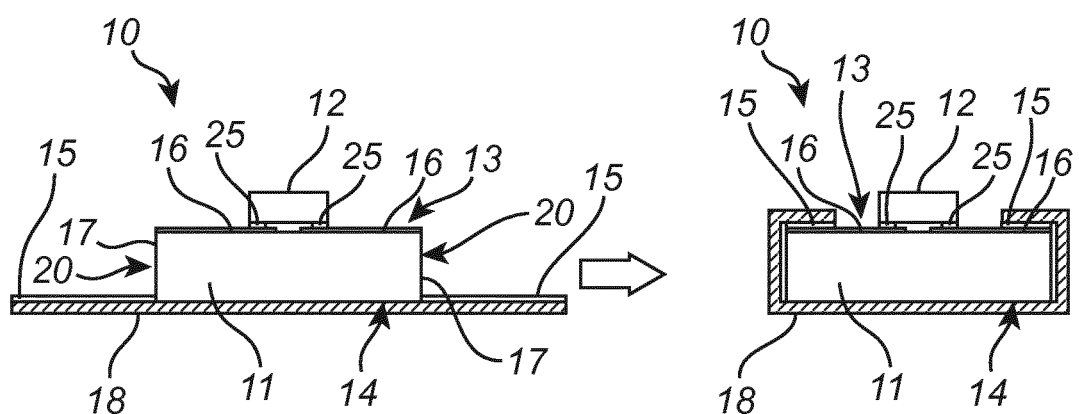

FIG. 6 is a schematic sectional side view of a lighting arrangement 10 according to another embodiment of the present invention, in an in part assembled state (left), and in an assembled state (right). The lighting arrangement 10 illustrated in FIG. 6 is similar to the lighting arrangement 10 illustrated in FIG. 5, and the same reference numerals in FIGS. 6 and 5 indicate the same or similar components, having the same or similar function. In accordance with the embodiment of the present invention illustrated in FIG. 6, the substrate 11 does not comprise electrically insulating elements (but the substrate 11 could do so), but the lighting arrangement 10 comprises electrically insulating elements 15 arranged on the thermally conductive element 18 such that a portion of each of the electrically insulating elements 15 is arranged between a portion of the thermally conductive element 18 and a respective one of the electrically conductive regions 16, and further such that another portion of each of the electrically insulating elements 15 is arranged between another portion of the thermally conductive element 18 and the circumferential edge 20, as illustrated in the right part of FIG. 6.

FIG. 7 is a schematic sectional side view of a lighting arrangement 10 according to another embodiment of the present invention, in an in part assembled state (left), and in an assembled state (right). The lighting arrangement 10 illustrated in FIG. 7 is similar to the lighting arrangement 10 illustrated in FIG. 5, and the same reference numerals in FIGS. 7 and 5 indicate the same or similar components, having the same or similar function. In accordance with the embodiment of the present invention illustrated in FIG. 7, the substrate 11 comprises electrically insulating elements 15*a* and 15*b*, which are disposed on the first side 13 of the substrate 11 and coupled to portions of the first side 13 of the substrate 11. In accordance with the embodiment of the present invention illustrated in FIG. 7, the electrically insulating elements 15*a* and 15*b* are arranged on respective ones of the electrically conductive regions 16—or electrically conductive tracks. Further in accordance with the embodiment of the present invention illustrated in FIG. 7, the lighting arrangement 10 comprises electrically insulating elements 15*c* and 15*d* arranged on the thermally conductive element 18 such that the electrically insulating elements 15*c* and 15*d* are arranged on the electrically insulating elements 15*a* and 15*b*, respectively, and so that the electrically insulating elements 15*a* and 15*c* are arranged between a portion of the thermally conductive element 18 and one of the electrically conductive regions 16 and the electrically insulating elements 15*b* and 15*d* are arranged between another portion of the thermally conductive element 18 and the other one of the electrically conductive regions 16, as illustrated in the right part of FIG. 7. In accordance with the embodiment of the present invention illustrated in FIG. 7, there are no electrically insulating elements shown which are arranged on the thermally conductive element 18 such that electrically insulating elements are arranged between the thermally conductive element 18 and the circumferential edge 20, such as illustrated in FIG. 6. However, the lighting arrangement 10 illustrated in FIG. 7 could possibly comprise one or more such electrically insulating elements arranged on the thermally conductive element 18 such that the electrically insulating elements are arranged between the thermally conductive element 18 and the circumferential edge 20, such as illustrated in FIG. 6.

FIG. 8 is a schematic sectional side view of a lighting arrangement 10 according to an embodiment of the present invention, in an in part assembled state (left), and in an assembled state (right). The lighting arrangement 10 comprises a substrate 11, which is configured to mechanically and electrically connect at least one light-emitting element 12 thereto. In accordance with the embodiment of the present invention illustrated in FIG. 8, the at least one light-emitting element 12 comprises a LED package 12, which comprises a LED die arranged in a housing. It is however to be understood that the at least one light-emitting element 12, in alternative, or in addition, could comprise another or other types of light-emitting elements. Also, it is to be understood that even though only one light-emitting element 12 is illustrated in FIG. 8, the lighting arrangement 10 could comprise in principle any number of light-emitting elements which the substrate 11 may be configured to mechanically and electrically connect to the substrate 11, as long as the substrate 11 has a size sufficient to allow for coupling such a number of light-emitting elements thereto.

The substrate 11 comprises a first side 13 and a second side 14. In accordance with the embodiment of the present invention illustrated in FIG. 8, the second side 14 is opposite to the first side 13. Thus, the first and second sides 13, 14 of the substrate 11 may be opposite, or substantially opposite, sides of the substrate 11. The substrate 11 comprises a circumferential edge 20 along a periphery of the substrate 11. As illustrated in FIG. 8, the circumferential edge 20 is extending between the first side 13 and the second side 14.

In accordance with the embodiment of the present invention illustrated in FIG. 8, the substrate 11 comprises electrically insulating elements 15 and electrically conductive regions 16 disposed on the first side 13 of the substrate 11. While there in FIG. 8 is shown two electrically insulating elements 15 and two electrically conductive regions 16, it is to be understood that the numbers of electrically insulating elements 15 and electrically conductive regions 16 shown are according to examples, and that there may be more or less than two electrically insulating elements and more or less than two electrically conductive regions comprised in or on the substrate 11.

As illustrated in FIG. 8, at least a portion of each electrically insulating element 15 may be arranged on at least a portion of one of the electrically conductive regions 16. Thus, each of the electrically conductive regions 16 may be covered at least partly by at least one electrically insulating element 15 of the substrate 11, as seen from above the first side 13 of the substrate 11.

The lighting arrangement 10 comprises a thermally conductive element 18. In accordance with the embodiment of the present invention illustrated in FIG. 8, the thermally conductive element 18 comprises a layer of thermally conductive material. The thermally conductive element 18 is arranged such that the thermally conductive element 18 is coupled to a portion of the first side 13 of the substrate 11 by the thermally conductive element 18 being coupled to an outer surface of each of the electrically insulating elements 15, and further such that the thermally conductive element 18 is not coupled to any of the electrically conducting regions 16.

In accordance with the embodiment of the present invention illustrated in FIG. 8, the thermally conductive element 18 may be arranged such that the thermally conductive element 18 is additionally coupled to at least a portion of an outer surface 17 of the circumferential edge 20, possibly across the entire outer surface 17 of the circumferential edge 20.

In accordance with the embodiment of the present invention illustrated in FIG. 8, the thermally conductive element 18 is arranged such that the thermally conductive element 18 is additionally coupled to at least a portion of the second side 14 of the substrate 11.

To this end, the thermally conductive element 18 may comprise at least one layer of thermally conductive material, and the (at least one layer of) the thermally conductive element 18 may be 'wrapped', or bent, around the substrate 11, or at least a part or portion thereof, as indicated in the left part of FIG. 8 by the dashed arrows. Possibly, the thermally conductive element 18 may be arranged such that the thermally conductive element 18 is coupled to the second side 14 of the substrate 11 across the entire, or substantially entire, second side 14.

The coupling of the thermally conductive element 18 to the electrically insulating elements 15 and the coupling of the thermally conductive element 18 to the circumferential edge 20 and to the second side 14 of the substrate 11 may for example be achieved by way of at least one connecting component (not shown in FIG. 8) configured to facilitate or enable the coupling or connection. Such a connecting component may for example comprise an adhesive or glue component, e.g., an adhesive or glue layer, or some other type of component. The adhesive or glue component, e.g., an adhesive or glue layer, may comprise a thermal adhesive or thermal glue.

As indicated in FIG. 8, the lighting arrangement 10 may possibly comprise a single thermally conductive element 18. However, the lighting arrangement 10 could, in accordance with one or more embodiments of the present invention, comprise two or more thermally conductive elements, which may be separately arranged or connected with each other (or there may be one or more thermally conductive elements separately arranged with each other and one or more thermally conductive elements connected with each other).

An example of where the lighting arrangement 10 comprises more than one thermally conductive element is illustrated in FIG. 9. FIG. 9 is a schematic sectional side view of a lighting arrangement 10 according to an embodiment of the present invention, in an in part assembled state (left), and in an assembled state (right). The lighting arrangement 10 illustrated in FIG. 9 is similar to the lighting arrangement 10 illustrated in FIG. 8, and the same reference numerals in FIGS. 8 and 9 indicate the same or similar components, having the same or similar function. The lighting arrangement 10 illustrated in FIG. 9 comprises two thermally conductive elements 18, 19: a first thermally conductive element 18 and a second thermally conductive element 19. In accordance with the embodiment of the present invention illustrated in FIG. 9, each of the first thermally conductive element 18 and the second thermally conductive element 19 comprises a layer of thermally conductive material, wherein the first thermally conductive element 18—or the layer of thermally conductive material of the first thermally conductive element 18—is arranged on the second thermally conductive element 19—or the layer of thermally conductive material of the second thermally conductive element 19. Possibly, any of the first thermally conductive element 18 and the second thermally conductive element 19 could comprise several layers which may be interconnected. Possibly, the lighting arrangement 10 could comprise more than two thermally conductive elements.

As mentioned in the foregoing with reference to FIG. 8, the coupling of the thermally conductive element 18 to the electrically insulating elements 15 and the coupling of the thermally conductive element 18 to the circumferential edge 20 and to the second side 14 of the substrate 11 may for be achieved for example by way of an adhesive or glue layer. An example of such a configuration is illustrated in FIG. 10, which is a schematic sectional side view of a lighting arrangement 10 according to another embodiment of the present invention, in an in part assembled state (left), and in an assembled state (right). The lighting arrangement 10 illustrated in FIG. 10 is similar to the lighting arrangements 10 illustrated in FIGS. 8 and 9, and the same reference numerals in FIG. 10 and in FIGS. 8 and 9 indicate the same or similar components, having the same or similar function. As illustrated in the left part of FIG. 10, coupling of the (first) thermally conductive element 18 to the electrically insulating elements 15 and to the circumferential edge 20, respectively, of the substrate 11 is achieved by way of a connecting component 21 comprising an adhesive or glue layer 21 (not shown in the right part of FIG. 10). The adhesive or glue layer 21 may for example comprise a thermal adhesive or thermal glue. As illustrated in the left part of FIG. 10, there may be provided a cover layer 22 for the adhesive or glue layer 21, which cover layer 22 may be removed from the adhesive or glue layer 21 such that the (first) thermally conductive element 18 can be coupled (e.g., glued or adhered) to the substrate 11.

Another example of where the lighting arrangement 10 comprises more than one thermally conductive element is illustrated in FIG. 11, which is a schematic sectional side view of a lighting arrangement 10 according to another embodiment of the present invention, in an in part assembled state (left), and in an assembled state (right). The lighting arrangement 10 illustrated in FIG. 11 is similar to the lighting arrangement 10 illustrated in FIGS. 8, 9 and 10, and the same reference numerals in FIG. 11 and in FIGS. 8, 9 and 10 indicate the same or similar components, having the same or similar function. The lighting arrangement 10 illustrated in FIG. 11 comprises two thermally conductive elements 18, 19: a first thermally conductive element 18 and a second thermally conductive element 19. In accordance with the embodiment of the present invention illustrated in FIG. 11, each of the first thermally conductive element 18 and the second thermally conductive element 19 comprises a layer of thermally conductive material. Further in accordance with the embodiment of the present invention illustrated in FIG. 11, the first thermally conductive element 18—or the layer of thermally conductive material of the first thermally conductive element 18—is coupled to one of the illustrated electrically insulating elements 15 and to a portion of (an outer surface 17 of) the circumferential edge 20, and the second thermally conductive element 19—or the layer of thermally conductive material of the second thermally conductive element 19—is coupled to the other one of the electrically insulating elements 15 and to another portion of (an outer surface 17 of) the circumferential edge 20. The first and second thermally conductive elements 18, 19 are hence arranged such that the respective ones of the first and second thermally conductive elements 18, 19 are coupled to respective, different, portions of (an outer surface 17 of) the circumferential edge 20 of the substrate 11. Thus, in accordance with the embodiment of the present invention illustrated in FIG. 11, the lighting arrangement 10 may comprise several thermally conductive elements, not all which may be (directly) coupled with each other, and which may be separately arranged with respect to each other. Another way to describe such a configuration is that the lighting arrangement 10 may comprise a thermally conductive element which may be segmented. As illustrated in FIG. 11, the first and second thermally conductive elements 18, 19 (or the thermally conductive element, if only one is comprised in the lighting arrangement 10) may not be coupled to the second side 14 of the substrate 11 across the entire second side 11, but only to a portion of the second side 14.

Another example of where the thermally conductive element may not be coupled to the second side 14 of the substrate 11 across the entire second side 11 is illustrated in FIG. 12.

FIG. 12 is a schematic sectional side view of a lighting arrangement 10 according to another embodiment of the present invention. The lighting arrangement 10 illustrated in FIG. 12 is similar to the lighting arrangement 10 illustrated in, for example, FIGS. 8 and 11, and the same reference numerals in FIG. 12 and in FIGS. 8 and 11 indicate the same or similar components, having the same or similar function. The lighting arrangement 10 illustrated in FIG. 12 comprises a thermally conductive element 18, and in accordance with the embodiment of the present invention illustrated in FIG. 12, the thermally conductive element 18 comprises a layer of thermally conductive material. Further in accordance with the embodiment of the present invention illustrated in FIG. 12, the thermally conductive element 18—or the layer of thermally conductive material of the thermally conductive element 18—is coupled to one of the electrically insulating elements 15 and to a portion of (an outer surface 17 of) the circumferential edge 20, and further to a portion of the second side 14 of the substrate 11. As illustrated in FIG. 12, the thermally conductive element 18 must not necessarily be coupled to each electrically insulating element 15 comprised in the lighting arrangement 10. The thermally conductive element 18 is coupled to at least one electrically insulating element 15 comprised in the lighting arrangement 10.

As illustrated in FIG. 11, the lighting arrangement 10 may comprise a thermally conductive element which may be segmented. Another example of such a lighting arrangement having a thermally conductive element that is segmented is illustrated in FIG. 13.

FIG. 13 is a schematic sectional side view of a portion of a lighting arrangement 10 according to an embodiment of the present invention from above a first side of the lighting arrangement 10, in an in part assembled state (left), and in an assembled state (right). The same reference numerals in FIG. 13 and in FIGS. 8 to 12 indicate the same or similar components, having the same or similar function. The lighting arrangement 10 comprises a substrate 11, which is configured to mechanically and electrically connect a plurality of light-emitting elements 12 thereto. In accordance with the embodiment of the present invention illustrated in FIG. 13, the light-emitting elements 12 comprise LED packages 12, each of which comprises a LED die arranged in a housing. It is however to be understood that the light-emitting elements 12 in alternative, or in addition, could comprise another or other types of light-emitting elements. Also, it is to be understood that even though three light-emitting elements 12 are illustrated in FIG. 13, the lighting arrangement 10 could comprise in principle any number of light-emitting elements which the substrate 11 may be configured to mechanically and electrically connect to the substrate 11, as long as the substrate 11 has a size sufficient to allow for coupling such a number of light-emitting elements thereto. The substrate 11 comprises a first side 13 and a second side (not shown in FIG. 13). The substrate 11 comprises electrically insulating elements 15a, 15b, 15c, 15d, 15e, 15f and electrically conductive regions 16a, 16b, 16c, 16d, 16e, 16f disposed on the first side 13 of the substrate 11. The numbers of electrically insulating elements 15a, 15b, 15c, 15d, 15e, 15f and electrically conductive regions 16a, 16b, 16c, 16d, 16e, 16f shown in FIG. 13 are according to examples, and there may be more or less electrically insulating elements and more or less electrically conductive regions than illustrated in FIG. 13.

As indicated in FIG. 13, at least a portion of each electrically insulating element 15a, 15b, 15c, 15d, 15e, 15f may be arranged on at least a portion of one of the electrically conductive regions 16a, 16b, 16c, 16d, 16e, 16E Thus, each of the electrically conductive regions 16a, 16b, 16c, 16d, 16e, 16f may be covered in part by at least one electrically insulating element 15a, 15b, 15c, 15d, 15e, 15f of the substrate 11, as seen from above the first side 13 of the substrate 11.

The portion of the lighting arrangement 10 illustrated in FIG. 13 comprises two thermally conductive elements 18, 19: a first thermally conductive element 18 and a second thermally conductive element 19. In accordance with the embodiment of the present invention illustrated in FIG. 13, each of the first thermally conductive element 18 and the second thermally conductive element 19 comprises a layer of thermally conductive material. The left part of FIG. 13 illustrates a state where the first thermally conductive element 18 and the second thermally conductive element 19 have not been coupled to the substrate 11 (or not completely coupled to the substrate 11), and the right part of FIG. 13 illustrates a state where the first thermally conductive element 18 and the second thermally conductive element 19 have been coupled to the substrate 11 (possibly completely coupled to the substrate 11). As illustrated in the right part of FIG. 13, and by comparing with the left part of FIG. 13, the first thermally conductive element 18 is coupled to the first side 13 of the substrate 11 such that it is coupled to four of the electrically insulating elements 15a, 15b, 15c, 15d, 15e, 15f, namely to the electrically insulating elements 15a, 15b, 15c, and 15d, and further such that the first thermally conductive element 18 is not coupled to any of the electrically conducting regions 16a, 16b, 16c, 16d, 16e, 16E Just as the first thermally conductive element 18, the second thermally conductive element 19 is coupled to the first side 13 of the substrate 11 such that it is coupled to four electrically insulating elements 15, namely to the electrically insulating elements 15c, 15d, 15e, and 15f, and further such that the second thermally conductive element 19 is not coupled to any of the electrically conducting regions 16a, 16b, 16c, 16d, 16e, 16E As illustrated in FIG. 13, both of the first thermally conductive element 18 and the second thermally conductive element 19 are coupled to the electrically insulating elements 15c and 15d, but at different portions thereof. And as illustrated in the right part of FIG. 13, the first thermally conductive element 18 and the second thermally conductive element 19 may overlie portions of the substrate 11 other than the electrically insulating elements 15a, 15b, 15c, 15d, 15e, 15f, and may possibly be coupled to those portions.

Even though not shown in FIG. 13, at least one of the first thermally conductive element 18 and the second thermally conductive element 19 is arranged such that at least one of the first thermally conductive element 18 and the second thermally conductive element 19 is coupled to at least a portion of the second side (not shown in FIG. 13) and to at least a portion of an outer surface of the circumferential edge (not shown in FIG. 13) of the substrate 11.

FIG. 14 is a schematic sectional side view of a portion of a lighting arrangement 10 according to another embodiment of the present invention from above a first side of the lighting arrangement 10, in an in part assembled state (left), and in an assembled state (right). The lighting arrangement 10 illustrated in FIG. 14 is similar to the lighting arrangement 10 illustrated in FIG. 13, and the same reference numerals in FIG. 14 and in FIG. 13 indicate the same or similar components, having the same or similar function. The lighting arrangement 10 illustrated in FIG. 14 comprises one (or a first) thermally conductive element 18, which in accordance with the illustrated embodiment of the present invention comprises a plurality of openings 23. Each of the openings 23 corresponds to one of the light-emitting elements 12, which in accordance with the illustrated embodiment of the present invention are constituted by LED packages 12. As illustrated in the right part of FIG. 14, and by comparing with the left part of FIG. 14, the thermally conductive element 18 is arranged relatively to the light-emitting elements 12, or vice versa, such that each of the light-emitting elements 12 extends through the opening 23 to which the light-emitting element 12 corresponds. As illustrated in FIG. 14, the openings 23 may be dimensioned and/or sized in relation to their corresponding light-emitting elements 12 such that an inner surface of each of the openings 23 is not in contact with the light-emitting element 12 which extends through the opening 23 (when the lighting arrangement 10 is in the assembled state illustrated in the right part of FIG. 14), and further such that the thermally conductive element 18 is not coupled to any one of the electrically conducting regions 16a, 16b, 16c, 16d, 16e, 16f.

FIG. 15 is a schematic sectional side view of a portion of a lighting arrangement 10 according to an embodiment of the present invention from above a first side of the lighting arrangement 10, in an in part assembled state (left), and in an assembled state (right). The lighting arrangement 10 illustrated in FIG. 15 is similar to the lighting arrangements 10 illustrated in FIGS. 13 and 14, and the same reference numerals in FIG. 15 and in FIGS. 13 and 14 indicate the same or similar components, having the same or similar function. The lighting arrangement 10 illustrated in FIG. 15 comprises one (or a first) thermally conductive element 18, which from above the first side 13 of the substrate 11, as illustrated in FIG. 15, has a shape similar to that of a comb, where the portions of the thermally conductive element 18 resembling the 'teeth' of the comb are interposed between the light-emitting elements 12.

FIG. 16 is a schematic sectional side view of a portion of a lighting arrangement 10 according to another embodiment of the present invention from above a first side of the lighting arrangement 10, in an in part assembled state (left), and in an assembled state (right). The lighting arrangement 10 illustrated in FIG. 16 is similar to the lighting arrangement 10 illustrated in FIG. 15, and the same reference numerals in FIG. 16 and in FIG. 15 indicate the same or similar components, having the same or similar function. The lighting arrangement 10 illustrated in FIG. 16 comprises attachment elements 24a, 24b, which may be configured to fixate the thermally conductive element 18 in a position in which the thermally conductive element 18 is coupled to the substrate 11. That is, the attachment elements 24a, 24b which may be configured to fixate the thermally conductive element 18 in a position in which the thermally conductive element 18 is coupled to portions of (an outer surface of) the electrically insulating elements 15a, 15b, 15c, 15d, 15e, 15f, and not coupled to any one of the electrically conducting regions 16a, 16b, 16c, 16d, 16e, 16f. In accordance with the embodiment of the present invention illustrated in FIG. 16, each of the attachment elements 24a, 24b comprises a protrusion disposed on the first side 13 of the substrate 11, which protrusions are schematically indicated at 24a, and corresponding receiving openings in the thermally conductive element 18, which receiving openings are schematically indicated at 24b. The protrusions 24a may be configured to fit into respective ones of the receiving openings 24b, as illustrated in the right part of FIG. 16, and by comparing with the left part of FIG. 16. The protrusions 24a may for example be configured to be press-fitted into respective ones of the receiving openings 24b. The number of attachment elements 24a, 24b illustrated in FIG. 16 is according to an example, and there may be more or less attachment elements than illustrated in FIG. 16. It is to be understood that the type of attachment elements 24a, 24b illustrated in FIG. 16 is according to an example, and another or other types of attachment elements are possible. For example, in alternative, or in addition, the attachment elements could for example comprise one or more of at least one clamp, at least one hook, and/or at least one clip or the like.

It is to be understood that even though according to each of the embodiments of the present invention illustrated in FIGS. 3 to 16 the thermally conductive element(s) is (are) in the form of—or comprises—one or more layers of thermally conductive material, this is not required, and the thermally conductive element(s) could in alternative, or in addition, have another configuration than a layer configuration, such as, for example, a structure which possibly may be plate-like and which may exhibit one or more bending and/or folding features such as, for example, one or more grooves and/or elongated through-holes, which may facilitate or allow for bending and/or folding the plate-like structure such that it becomes arranged in relation to the substrate similarly or the same as any of the thermally conductive element(s) of the lighting arrangements described in the foregoing.

It is further to be understood that even though according to each of the embodiments of the present invention illustrated in FIGS. 8 to 16 the lighting arrangement 10 comprises one or more electrically insulating elements disposed on the first side 13 of the substrate 11, which one or more electrically insulating elements the thermally conductive element(s) is (are) coupled to, it is to be understood that for each of the embodiments of the present invention illustrated in FIGS. 8 to 16, the one or more electrically insulating elements may be omitted, and the thermally conductive element(s) may not necessarily be coupled to the first side 13 of the substrate 11.

FIG. 17 is a schematic block diagram of a lighting device 100 according to an embodiment of the present invention, comprising a lighting arrangement 10 according to an embodiment of the present invention, for example a lighting arrangement 10 as described in the foregoing with reference to any one of FIGS. 3-16. The substrate (not shown in FIG. 17) of the lighting arrangement 10 may be configured to mechanically and electrically connect at least one light-emitting element thereto. At least one electrically conducting region of the substrate may be arranged such that the at least one electrically conducting region is connectable to a power source for connecting the at least one light-emitting element to the power source in order to provide electrical power to the at least one light-emitting element. The lighting device 100 may for example comprise a lamp, light engine or luminaire. The lamp may for example comprise or be constituted by a LED lamp. The lighting device 100 may hence for example be used in a LED lamp. The lamp may for example comprise a filament lamp, such as a halogen, or incandescent replacement lamp, or an arc lamp, such as a high pressure sodium replacement lamp.

In conclusion, a lighting arrangement is disclosed. The lighting arrangement comprises a substrate for mechanically and electrically connecting at least one light-emitting element thereto. The substrate comprises at least a first side and a second side, and a circumferential edge along a periphery of the substrate, the circumferential edge extending between the first side and the second side, and at least one electrically conductive region disposed on the first side. At least one electrically conductive region may be arranged such that at least one light-emitting element connected to the substrate is connected to the at least one electrically conductive region such that electrical power can be provided to the at least one light-emitting element via the at least one electrically conductive region. The lighting arrangement comprises at least one thermally conductive element arranged such that the at least one thermally conductive element is coupled to at least a portion of the second side and to at least a portion of an outer surface of the circumferential edge, and such that the at least one thermally conductive element is not coupled to the at least one electrically conducting region.

While the present invention has been illustrated in the appended drawings and the foregoing description, such illustration is to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A lighting arrangement comprising:
   at least one light-emitting element,
   a substrate for mechanically and electrically connecting at least one light-emitting element thereto, the substrate comprising:
      at least a first side and an opposite second side;
      a circumferential edge along a periphery of the substrate, the circumferential edge extending between the first side and the second side; and
      at least one electrically conductive region disposed on the first side, at least one electrically conductive region being arranged such that at the least one light-emitting element connected to the substrate is connected to the at least one electrically conductive region such that electrical power can be provided to the at least one light-emitting element via the at least one electrically conductive region; and
   said lighting arrangement further comprises at least one thermally conductive element, wherein the thermally conductive element is coupled to one portion of the substrate and bent around at least another portion of the first and/or second sides and an outer surface of the circumferential edge,
   the lighting arrangement further comprises electrically insulating elements disposed on the first side and arranged on at least one of the electrically conductive regions and wherein the bent portion of the thermally conductive element is disposed on the first side and the electrically insulating elements, and such that the at least one thermally conductive element is not coupled to the at least one electrically conducting region and the at least one light-emitting element, therewith realizing that the at least one electrically conducting region may not have to be sized and/or dimensioned so as to be able to provide for a sufficient thermal management capability or capacity.

2. A lighting arrangement according to claim 1, wherein the at least one thermally conductive element is further arranged such that the at least one thermally conductive element is coupled to at least a portion of the first side.

3. A lighting arrangement according to claim 1, wherein the at least one thermally conductive element is arranged such that the at least one thermally conductive element is coupled to the second side across the entire second side.

4. A lighting arrangement according to claim 1, wherein the substrate is configured to mechanically and electrically connect at least one light-emitting element thereto, and wherein at least one electrically conducting region is arranged such that the at least one electrically conducting region is connectable to a power source for connecting the at least one light-emitting element to the power source in order to provide electrical power to the at least one light-emitting element.

5. A lighting arrangement according to claim 1, wherein at least one electrically insulating element is coupled to at least one portion of the first side and/or to at least one portion of the outer surface of the circumferential edge.

6. A lighting arrangement according to claim 1, wherein at least a portion of at least one electrically insulating element is arranged on at least a portion of at least one electrically conductive region.

7. A lighting arrangement according to claim 1, wherein the at least one thermally conductive element is further arranged such that the thermally conductive element is coupled to at least a portion of at least one electrically insulating element.

8. A lighting arrangement according to claim 7, wherein the at least a portion of at least one electrically insulating element is arranged on at least a portion of at least one electrically conductive region, and the at least one thermally conductive element is arranged such that the at least a portion of at least one electrically insulating element is arranged between the thermally conductive element and the at least a portion of at least one electrically conductive region.

9. A lighting arrangement according to claim 1, wherein at least one electrically insulating element is arranged on the at least one thermally conductive element such that at least one portion of the at least one electrically insulating element is arranged between the at least one thermally conductive element and the circumferential edge.

10. A lighting arrangement according to claim 1, wherein the at least one thermally conductive element comprises at least one layer of thermally conductive material.

11. A lighting arrangement according to claim 1, comprising at least two thermally conductive elements comprising at least a first thermally conductive element and a second thermally conductive element, wherein the first thermally conductive element is arranged on the second thermally conductive element.

12. A lighting arrangement according to claim 1, wherein the substrate is configured to mechanically and electrically connect at least one light-emitting element thereto, wherein the at least one thermally conductive element comprises at least one opening, wherein at least one opening corresponds to at least one light-emitting element mechanically and electrically connected to the substrate, and wherein the at least one thermally conductive element is arranged relatively to the at least one light-emitting element, or vice versa, such that at least one light-emitting element corresponding to at least one opening extends through the at least one opening.

13. A lighting arrangement according to claim 1, further comprising at least one attachment element configured to fixate the at least one thermally conductive element in a position in which the at least one thermally conductive element is coupled to at least a portion of the second side and at least a portion of the outer surface of the circumferential edge, and in which the at least one thermally conductive element is not coupled to the at least one electrically conducting region.

14. A lighting device comprising a lighting arrangement according to claim 1, wherein the substrate is configured to mechanically and electrically connect at least one light-emitting element thereto, and wherein at least one electrically conducting region is arranged such that the least one electrically conducting region is connectable to a power source for connecting the at least one light-emitting element to the power source in order to provide electrical power to the at least one light-emitting element.

* * * * *